(12) United States Patent
Wang

(10) Patent No.: US 10,355,138 B2
(45) Date of Patent: Jul. 16, 2019

(54) LTPS TFT SUBSTRATE AND METHOD FOR MANUFACTURING THE SAME

(71) Applicant: WUHAN CHINA STAR OPTOELECTRONICS TECHNOLOGY CO., LTD., Wuhan, Hubei (CN)

(72) Inventor: Tao Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 25 days.

(21) Appl. No.: 15/735,614

(22) PCT Filed: Jun. 22, 2017

(86) PCT No.: PCT/CN2017/089620
§ 371 (c)(1),
(2) Date: Dec. 12, 2017

(87) PCT Pub. No.: WO2018/218712
PCT Pub. Date: Dec. 6, 2018

(65) Prior Publication Data
US 2018/0351000 A1    Dec. 6, 2018

(30) Foreign Application Priority Data

Jun. 2, 2017 (CN) .......................... 2017 1 0412498

(51) Int. Cl.
*H01L 29/786* (2006.01)
*H01L 27/12* (2006.01)
(Continued)

(52) U.S. Cl.
CPC ...... *H01L 29/78633* (2013.01); *G02F 1/1368* (2013.01); *G02F 1/13439* (2013.01);
(Continued)

(58) Field of Classification Search
CPC . H01L 29/4908; H01L 29/66742–6678; H01L 29/786–78696; H01L 27/12–13;
(Continued)

(56) References Cited

U.S. PATENT DOCUMENTS

2003/0230748 A1* 12/2003 Shih .................. G02F 1/136209
257/59
2016/0133755 A1* 5/2016 Tian .................. H01L 21/02675
257/72
(Continued)

FOREIGN PATENT DOCUMENTS

| CN | 1612358 A | 5/2005 |
| CN | 105470195 A | 4/2016 |
| CN | 105514119 A | 4/2016 |

*Primary Examiner* — Scott B Geyer
(74) *Attorney, Agent, or Firm* — Mark M. Friedman

(57) ABSTRACT

A low temperature polysilicon (LTPS) thin film transistor (TFT) substrate and a method for manufacturing the same are provided. The method includes: sequentially forming a plurality of light-shielding portions, a buffer layer, and a plurality of island-shaped polysilicon portions on a substrate; performing light ion doping over two sides of the island-shaped polysilicon portions to form doped regions and channel regions; sequentially forming a gate insulating layer and a plurality of gate electrodes; performing heavy ion doping over the doped region that are not covered by the gate electrodes to form N-type heavily doped regions and N-type lightly doped regions; and forming an interlayer insulating layer as well as a source electrode and a drain electrode which are electrically connected to the N-type heavily doped regions on the gate electrodes.

20 Claims, 5 Drawing Sheets

(51) Int. Cl.
    *H01L 21/266*     (2006.01)
    *H01L 21/02*     (2006.01)
    *H01L 29/66*     (2006.01)
    *H01L 29/167*     (2006.01)
    *H01L 21/285*     (2006.01)
    *H01L 21/3213*     (2006.01)
    *G02F 1/1343*     (2006.01)
    *H01L 21/027*     (2006.01)
    *G02F 1/1362*     (2006.01)
    *G02F 1/1368*     (2006.01)
    *G02F 1/1333*     (2006.01)

(52) U.S. Cl.
    CPC .... *G02F 1/136209* (2013.01); *H01L 21/0274* (2013.01); *H01L 21/02271* (2013.01); *H01L 21/02532* (2013.01); *H01L 21/02595* (2013.01); *H01L 21/266* (2013.01); *H01L 21/2855* (2013.01); *H01L 21/32139* (2013.01); *H01L 27/1222* (2013.01); *H01L 27/1248* (2013.01); *H01L 27/1262* (2013.01); *H01L 27/1288* (2013.01); *H01L 29/167* (2013.01); *H01L 29/66757* (2013.01); *H01L 29/78675* (2013.01); *G02F 1/133345* (2013.01); *G02F 2001/13685* (2013.01); *G02F 2001/133357* (2013.01); *G02F 2202/104* (2013.01)

(58) Field of Classification Search
    CPC ......... H01L 2924/13069; H01L 51/0508–057; H01L 29/04–045; H01L 29/78633; H01L 21/02532; H01L 21/266; H01L 21/02107–02362; H01L 29/16–1608; H01L 29/18–185; H01L 29/22–2206; H01L 29/36–365
    See application file for complete search history.

(56)     References Cited

U.S. PATENT DOCUMENTS

| | | | |
|---|---|---|---|
| 2017/0154773 A1* | 6/2017 | Zhou | H01L 21/02532 |
| 2018/0039116 A1* | 2/2018 | Li | G02F 1/133345 |
| 2018/0047764 A1* | 2/2018 | Deng | H01L 21/77 |
| 2018/0182785 A1* | 6/2018 | Chen | H01L 27/1288 |
| 2018/0211978 A1* | 7/2018 | Guo | H01L 27/1222 |
| 2019/0013409 A1* | 1/2019 | Li | H01L 27/1259 |

* cited by examiner

LTPS TFT SUBSTRATE AND METHOD FOR MANUFACTURING THE SAME

FIELD OF THE DISCLOSURE

The present disclosure relates to the field of manufacturing liquid crystal display panels, and more particularly to a low temperature polysilicon (LTPS) thin film transistor (TFT) substrate and a method for manufacturing the same.

BACKGROUND

In contemporary times, there is a significant increase in using displays to communicate visible signals. For more widespread future use, development of the displays focuses on light weight, thin thickness, low energy consumption, low manufacturing cost, and better display quality.

LTPS technique is a new technique to manufacture TFT substrates. Compared to conventional a-Si techniques, LTPS displays exhibit advantages such as quick response speed, high brightness, high degree of resolution, and lower energy consumption.

N-type LTPS TFT substrates, generally having a self-alignment structure, are configured to have a gate electrode covering an underneath non-doped polysilicon region (i.e., channel region) without an overlapping doped region. However, with such conventional design of LTPS TFT substrate, resistance of the lightly doped region is constant and cannot be adjusted, therefore, under higher voltage of drain electrode, there is serious impact ionization in the region of the drain electrode, resulting in kink effect and having unfavorable influence on long-term stable operation of devices.

Therefore, there is a need to solve the problems encountered in the prior art.

SUMMARY OF THE DISCLOSURE

The object of the present disclosure is to provide a low temperature polysilicon (LTPS) thin film transistor (TFT) substrate and a method for manufacturing the same.

To solve the above-mentioned problems, the present discloses provides the following schemes.

The present disclosure provides a method for manufacturing an LTPS TFT substrate, comprising steps of:

providing a substrate;

forming a plurality of light-shielding portions on the substrate, and forming a buffer layer on the light-shielding portions and the substrate;

depositing an LTPS layer on the buffer layer, patterning the LTPS layer to correspondingly form a plurality of island-shaped polysilicon portions over each of the light-shielding portions, and performing blanket ion doping over each of the island-shaped polysilicon portions;

coating a photoresist material on each of the island-shaped polysilicon portions, pattering the photoresist material to form a plurality of photoresist portions, and performing light ion doping over two sides of each of the island-shaped polysilicon portions by using the photoresist portions as a mask to form two doped regions at two sides of each of the island-shaped polysilicon portions and to form one channel region between the two doped regions;

removing the photoresist portions, sequentially forming a gate insulating layer and a first metal layer on the island-shaped polysilicon portions, and patterning the first metal layer to correspondingly form a gate electrode on each of the island-shaped polysilicon portions; wherein the gate electrodes have a width smaller than width of the island-shaped polysilicon portions, each of the gate electrodes covers each of the channel regions in a way that two ends of each of the gate electrodes exceed two ends of each of the channel regions by a distance and each of the gate electrodes covers a portion of the doped regions;

performing heavy ion doping over each of the doped region that are not covered by the gate electrodes by using the gate electrodes as a mask to form two N-type heavily doped regions at two sides of each of the island-shaped polysilicon portions, and to serve the doped regions disposed between each of the two N-type heavily doped regions and the channel region as N-type lightly doped regions; and forming an interlayer insulating layer as well as a plurality of source electrodes and a plurality of drain electrodes which are electrically connected to each of the N-type heavily doped regions on the gate electrodes.

In some embodiments, ions used in performing the light ion doping over the two sides of each of the island-shaped polysilicon portions by using the photoresist portions as the mask are P ions.

In some embodiments, ions used in performing the heavy ion doping over each of the doped region that are not covered by the gate electrodes by using the gate electrodes as the mask are P ions.

In some embodiments, ions used in performing the blanket ion doping over each of the island-shaped polysilicon portions are B ions.

In some embodiments, the step of forming the light-shielding portions on the substrate comprises steps of:

depositing a second metal layer on the substrate by physical vapor deposition, and coating a photoresist material thereon; and patterning the second metal layer by photolithography and etching to form the light-shielding portions that are separate from one another.

In some embodiments, the step of forming the interlayer insulating layer as well as the source electrodes and the drain electrodes which are electrically connected to each of the N-type heavily doped regions on the gate electrodes comprises steps of:

performing blanket deposition of the interlayer insulating layer by chemical vapor deposition;

forming two first through-holes on the interlayer insulating layer and the gate insulating layer above each of the two N-type heavily doped regions by photolithography to expose the N-type heavily doped regions; and performing blanket deposition of a third metal layer, and patterning the third metal layer to form the source electrodes and the drain electrodes; wherein each of the source electrodes and the drain electrodes are electrically connected to one of the N-type heavily doped regions via one of the first through-holes, respectively.

In some embodiments, the step of sequentially forming the gate insulating layer and the first metal layer on the island-shaped polysilicon portions, and the step of patterning the first metal layer to correspondingly form the gate electrode on each of the island-shaped polysilicon portions comprises steps of:

depositing an insulating layer on the substrate by chemical vapor deposition;

depositing the first metal layer on the substrate by physical vapor deposition, and coating a photoresist material; and patterning the first metal layer by photolithography and etching to form the gate electrodes that are separate from one another.

In some embodiments, after forming the interlayer insulating layer as well as the source electrodes and the drain electrodes which are electrically connected to each of the N-type heavily doped regions on the gate electrodes, the method further comprises steps of:

sequentially depositing a planarization layer and a common electrode material layer on the interlayer insulating layer, the source electrodes, and the drain electrodes;

removing a portion of the common electrode material layer above each of the drain electrodes by photolithography and etching to form a common electrode on the planarization layer;

forming a passivation layer on the planarization layer and the common electrode;

forming a plurality of second through-holes on the planarization layer and the passivation layer above each of the drain electrodes by photolithography to expose the drain electrodes; and performing blanket deposition of a pixel electrode material layer, patterning the pixel electrode material layer to form a plurality of pixel electrodes on the passivation layer; wherein each of the pixel electrodes is electrically connected to one of the drain electrodes via one of the second through-holes.

In some embodiments, the pixel electrodes are made of indium tin oxide (ITO).

The present disclosure further provides a method for manufacturing an LTPS TFT substrate, comprising steps of:

providing a substrate;

forming a plurality of light-shielding portions on the substrate, and forming a buffer layer on the light-shielding portions and the substrate;

depositing an LTPS layer on the buffer layer, patterning the LTPS layer to correspondingly form a plurality of island-shaped polysilicon portions over each of the light-shielding portions, and performing blanket ion doping over each of the island-shaped polysilicon portions;

coating a photoresist material on each of the island-shaped polysilicon portions, pattering the photoresist material to form a plurality of photoresist portions, and performing light ion doping over two sides of each of the island-shaped polysilicon portions by using the photoresist portions as a mask to form two doped regions at two sides of each of the island-shaped polysilicon portions and to form one channel region between the two doped regions;

removing the photoresist portions, sequentially forming a gate insulating layer and a first metal layer on the island-shaped polysilicon portions, and patterning the first metal layer to correspondingly form a gate electrode on each of the island-shaped polysilicon portions; wherein the gate electrodes have a width smaller than width of the island-shaped polysilicon portions, each of the gate electrodes covers each of the channel regions in a way that two ends of each of the gate electrodes exceed two ends of each of the channel regions by a distance and each of the gate electrodes covers a portion of the doped regions;

performing heavy ion doping over each of the doped region that are not covered by the gate electrodes by using the gate electrodes as a mask to form two N-type heavily doped regions at two sides of each of the island-shaped polysilicon portions, and to serve the doped regions disposed between each of the N-type heavily doped regions and the channel region as N-type lightly doped regions;

performing blanket deposition of an interlayer insulating layer;

forming two first through-holes on the interlayer insulating layer and the gate insulating layer above each of the two N-type heavily doped regions to expose the N-type heavily doped regions;

performing blanket deposition of a third metal layer, and patterning the third metal layer to form a plurality of source electrodes and a plurality of drain electrodes; wherein each of the source electrodes and each of the drain electrodes are electrically connected to one of the N-type heavily doped regions via one of the first through-holes, respectively; and sequentially forming a planarization layer, a common electrode, a passivation layer, and a plurality of pixel electrodes with each electrically connected to one of the drain electrodes on the interlayer insulating layer, the source electrodes, and the drain electrodes.

In some embodiments, ions used in performing the light ion doping over the two sides of each of the island-shaped polysilicon portions by using the photoresist portions as the mask are P ions, and ions used in performing the heavy ion doping by using the gate electrodes as the mask over each of the doped region that are not covered by the gate electrodes are P ions.

In some embodiments, ions used in performing the blanket ion doping over each of the island-shaped polysilicon portions are B ions.

In some embodiments, the step of forming the light-shielding portions on the substrate comprises steps:

depositing a second metal layer on the substrate by physical vapor deposition, and coating a photoresist material thereon; and patterning the second metal layer by photolithography and etching to form of the light-shielding portions that are separate from one another.

In some embodiments, the step of sequentially forming the gate insulating layer and the first metal layer on the island-shaped polysilicon portions, and the step of patterning the first metal layer to correspondingly form the gate electrode on each of the island-shaped polysilicon portions comprises:

depositing an insulating layer on the substrate by chemical vapor deposition;

depositing the first metal layer on the substrate by physical vapor deposition, and coating a photoresist material; and patterning the first metal layer by photolithography and etching to form the gate electrodes that are separate from one another.

In some embodiments, the steps of sequentially forming the planarization layer, the common electrode, the passivation layer, and the pixel electrodes with each electrically connected to one of the drain electrodes on the interlayer insulating layer, the source electrodes, and the drain electrodes comprises steps of:

sequentially depositing the planarization layer and a common electrode material layer on the interlayer insulating layer, the source electrodes, and the drain electrodes;

removing a portion of the common electrode material layer above each of the drain electrodes by photolithography and etching to form the common electrode on the planarization layer;

forming the passivation layer on the planarization layer and the common electrode;

forming a plurality of second through-holes on the planarization layer and the passivation layer above each of the drain electrodes by photolithography to expose the drain electrodes;

performing blanket deposition of a pixel electrode material layer, patterning the pixel electrode material layer to form the pixel electrodes on the passivation layer; wherein each of the pixel electrodes is electrically connected to one of the drain electrodes via one of the second through-holes.

In some embodiments, chemical vapor deposition is used in performing blanket deposition of the interlayer insulating layer.

In some embodiments, the pixel electrodes are made of indium tin oxide (ITO).

Further, the present disclosure provides an LTPS TFT substrate, comprising:

a substrate;

a plurality of light-shielding portions disposed on the substrate;

a buffer layer disposed on the substrate and the light-shielding portions;

a plurality of polysilicon portions disposed on the buffer layer, wherein each of the polysilicon portions comprises: a channel region disposed in an intermediate area of each of the polysilicon portions, two N-type heavily doped regions disposed at two sides of each of the polysilicon portions, and N-type lightly doped regions disposed between the channel region and the adjacent N-type heavily doped regions;

a gate insulating layer disposed on the polysilicon portions and the buffer layer;

a plurality of gate electrodes disposed on the gate insulating layer, wherein the gate electrodes have a width smaller than width of the polysilicon portions, and each of the gate electrodes covers each of the channel regions and the N-type lightly doped regions;

an interlayer insulating layer disposed above the gate electrodes and the gate insulating layer;

a plurality of source electrodes disposed on the interlayer insulating layer, wherein each of the source electrodes is electrically connected to one of the N-type heavily doped regions disposed at one end of one of the polysilicon portions; and a plurality of drain electrodes disposed on the interlayer insulating layer, wherein each of the drain electrodes is electrically connected to the other of the N-type heavily doped regions disposed at the other end of one of the polysilicon portions.

In some embodiments, there are two first through-holes disposed on the gate insulating layer and the interlayer insulating layer above the N-type heavily doped regions, and each of the source electrodes and each of the drain electrodes are electrically connected to one of the N-type heavily doped regions via one of the first through-holes, respectively.

In some embodiments, wherein the LTPS TFT substrate further comprises:

a planarization layer disposed on the source electrodes, the drain electrodes, and the interlayer insulating layers;

a common electrode disposed on the planarization layer;

a passivation layer disposed on the common electrode and the planarization; and a plurality of pixel electrodes disposed on the passivation layer, wherein there are a plurality of second through-holes disposed on the planarization layer and the passivation layer above each of the drain electrodes, and each of the pixel electrodes is electrically connected to one of the drain electrodes via one of the second through-holes.

The method for manufacturing an LTPS TFT substrate according to the present disclosure includes: sequentially forming a plurality of light-shielding portions, a buffer layer, and a plurality of island-shaped polysilicon portions on the substrate; performing light ion doping over two sides of the island-shaped polysilicon portions to form doped regions and channel regions; sequentially forming a gate insulating layer and a plurality of gate electrodes, wherein each of the gate electrodes covers each of the channel regions in a way that two ends of each of the gate electrodes exceed two ends of each of the channel regions by a distance and each of the gate electrodes covers a portion of the doped regions; performing heavy ion doping over the doped region that are not covered by the gate electrodes to form N-type heavily doped regions and N-type lightly doped regions; forming an interlayer insulating layer as well as a source electrode and a drain electrode which are electrically connected to the N-type heavily doped regions on the gate electrodes. According to the present disclosure, the N-type TFT structure in the LTPS TFT substrate is replaced with an N-type TFT structure where the gate electrodes overlap the lightly doped regions. It is by voltage of the gate electrode that resistance variation of the lightly doped region can be controlled. Therefore, kink effect occurring in N-type TFT can be suppressed, thus improving operation performance of devices.

DETAILED DESCRIPTION

Figure 1:
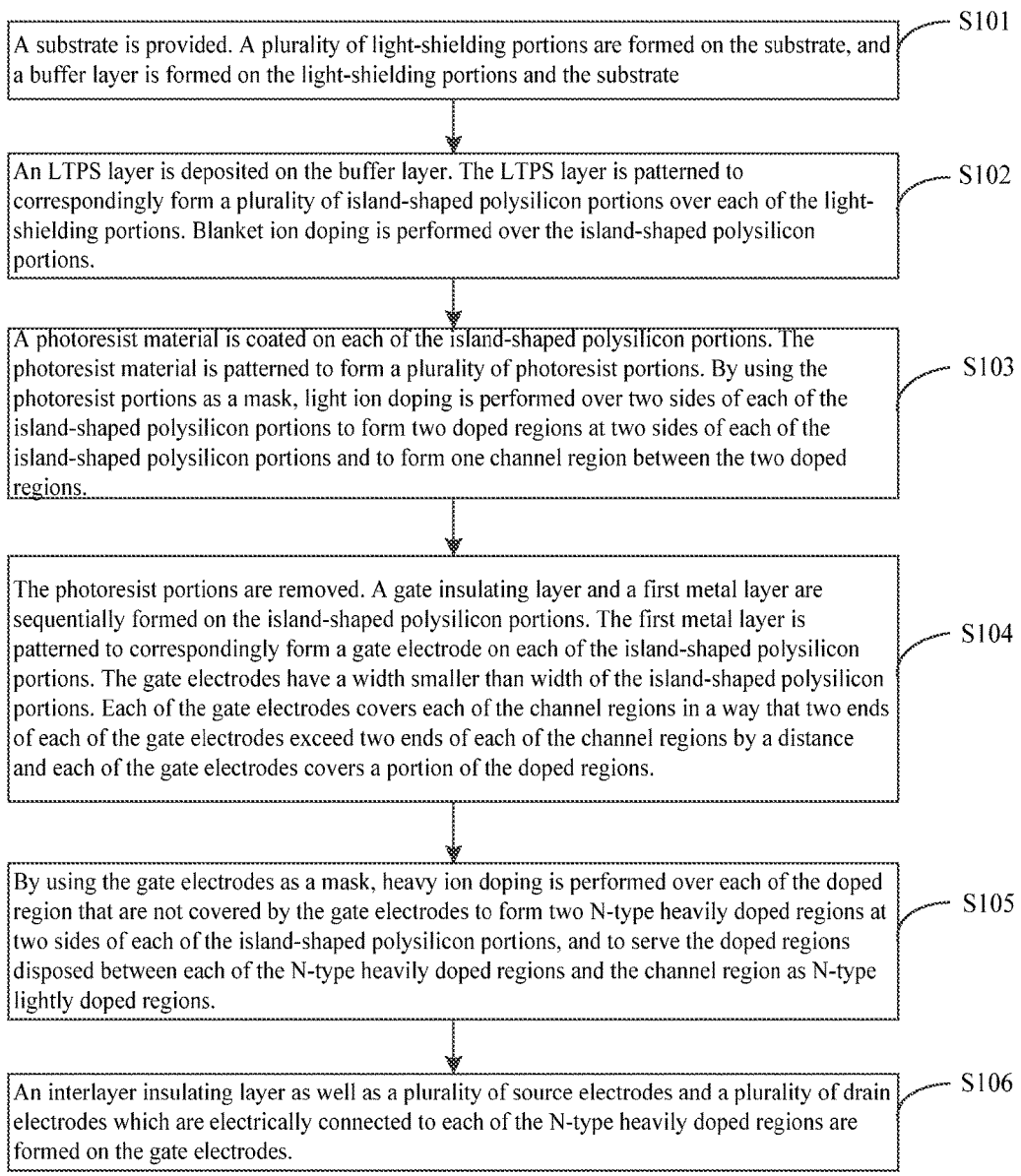
FIG. 1 is a schematic diagram showing a flow of a method for manufacturing an LTPS TFT substrate according to a preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

In addition, the terms "first" and "second" are used for the purpose of description and should not be interpreted to indicate or imply relative importance or the number of technical features. Thus, the technical features defined by "first", "second" may explicitly or implicitly include one or more of the features. In the description of the present disclosure, the meaning of "plurality" is two or more, unless explicitly specifically limited. Further, the term "comprising" and any variations thereof are intended to cover non-exclusive inclusion.

Please refer to FIG. 1 which is a schematic diagram showing a flow of a method for manufacturing an LTPS TFT substrate according to a preferred embodiment of the present disclosure. As shown in FIG. 1, the method for manufacturing an LTPS TFT substrate according to a preferred embodiment of the present disclosure includes the following steps.

In step S101, a substrate is provided. A plurality of light-shielding portions are formed on the substrate, and a buffer layer is formed on the light-shielding portions and the substrate.

In step S102, an LTPS layer is deposited on the buffer layer. The LTPS layer is patterned to correspondingly form a plurality of island-shaped polysilicon portions over each of the light-shielding portions. Blanket ion doping is performed over the island-shaped polysilicon portions.

In step S103, a photoresist material is coated on each of the island-shaped polysilicon portions. The photoresist material is patterned to form a plurality of photoresist portions. By using the photoresist portions as a mask, light ion doping is performed over two sides of each of the island-shaped polysilicon portions to form two doped regions at two sides of each of the island-shaped polysilicon portions and to form one channel region between the two doped regions.

In step S104, the photoresist portions are removed. A gate insulating layer and a first metal layer are sequentially formed on the island-shaped polysilicon portions. The first metal layer is patterned to correspondingly form a gate electrode on each of the island-shaped polysilicon portions. The gate electrodes have a width smaller than width of the island-shaped polysilicon portions. Each of the gate electrodes covers each of the channel regions in a way that two ends of each of the gate electrodes exceed two ends of each of the channel regions by a distance and each of the gate electrodes covers a portion of the doped regions.

In step S105, by using the gate electrodes as a mask, heavy ion doping is performed over each of the doped region that are not covered by the gate electrodes to form two N-type heavily doped regions at two sides of each of the island-shaped polysilicon portions, and to serve the doped regions disposed between each of the N-type heavily doped regions and the channel region as N-type lightly doped regions.

In step S106, an interlayer insulating layer as well as a plurality of source electrodes and a plurality of drain electrodes which are electrically connected to each of the N-type heavily doped regions are formed on the gate electrodes.

Now, a detailed description with reference to FIGS. 2A-2C for exemplifying the steps of a method for manufacturing an LTPS TFT substrate is provided below.

In step S101, a substrate is provided. The substrate is a glass substrate. A plurality of light-shielding portions are formed on the substrate. The light-shielding portions are made of an opaque metal material for preventing light emitted from backlight source from directly illuminating TFTs which may have adverse influence on logic circuits of substrate. Preferably, the light-shielding portions are made of opaque metal (such as Al, Ag, Cu, Mo, Au, etc.) or any combinations thereof, or alloy of any metals. In some embodiments, as shown in FIG. 2A, physical vapor deposition (PVD) is used to deposit a second metal layer 11 on the substrate 100. After a photoresist material is coated thereon, the second metal layer 11 is patterned by using photolithography and etching to form a plurality of light-shielding portions 111.

Then, blanket deposition of an insulating material is performed by chemical vapor deposition (CVD) to from a buffer layer 12 on the light-shielding portions and the substrate 100. The buffer layer 12 can be a composite layer consisted of a silicon nitride layer and a silicon oxide layer. In some embodiments, the silicon nitride layer has a thickness ranging from 40 nm to 100 nm, and the silicon oxide layer has a thickness ranging from 100 nm to 200 nm.

Figure 2A:
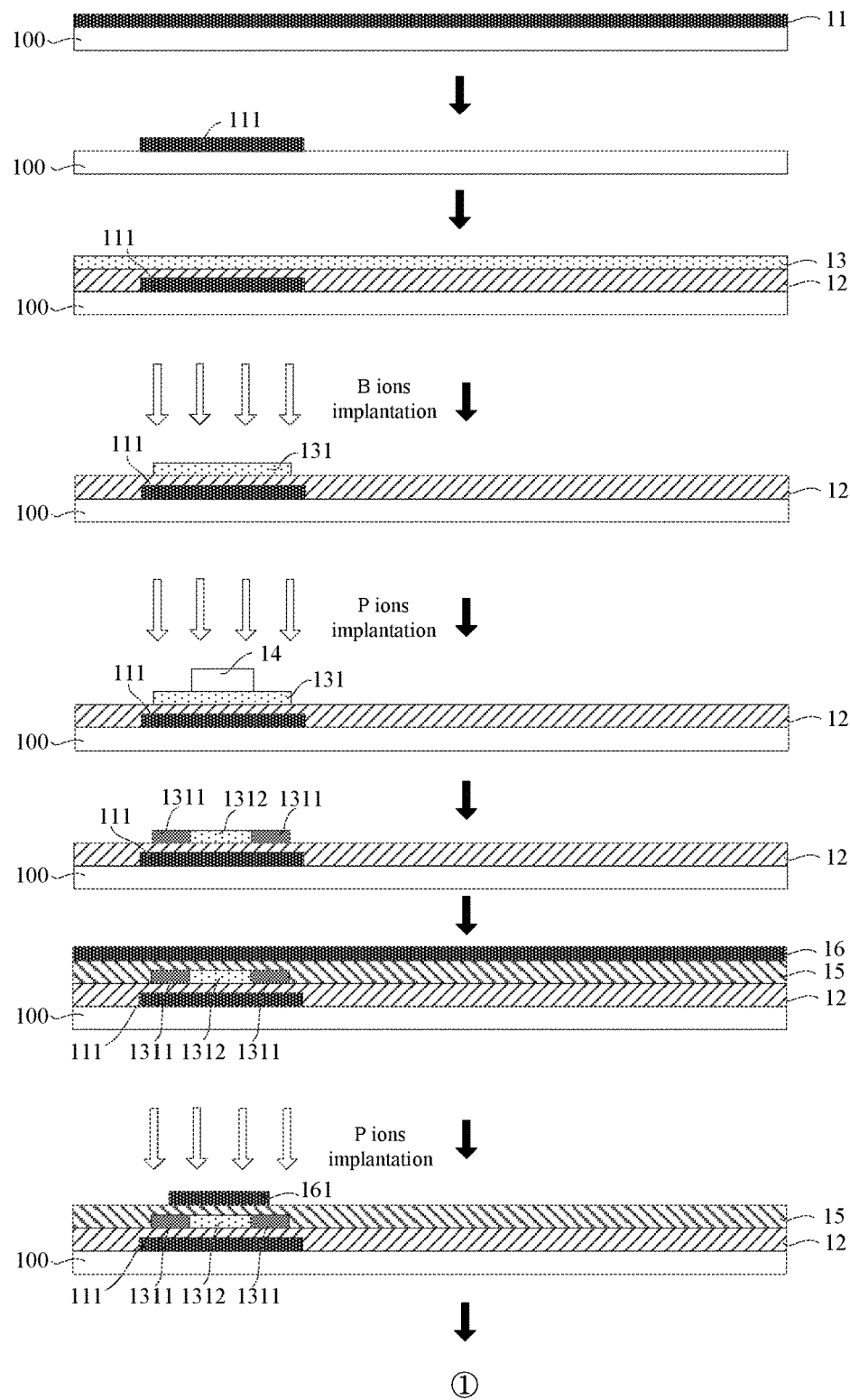
FIGS. 2A-2C are schematic diagrams showing the steps of a method for manufacturing an LTPS TFT substrate according to a preferred embodiment of the present disclosure.

In step S102, as shown in FIG. 2A, blanket deposition of a LTPS layer 13 is performed. In some embodiments, the LTPS layer 13 is further patterned by using photolithography and etching to correspondingly form a plurality of island-shaped polysilicon portions 131 over each of the light-shielding portions 111. Thereafter, blanket ion doping (i.e., ion implantation) is performed over the island-shaped polysilicon portions 131 in order to adjust the threshold voltage (Vth) of N-type TFT. Ions used in performing the blanket ion doping over the island-shaped polysilicon portions 131 are B ions.

In step S103, as shown also in FIG. 2A, a photoresist material is coated on the buffer layer 12. The photoresist material is patterned by using photolithography to form a plurality of photoresist portions 14. Each of the photoresist portions 14 is disposed above one of the island-shaped polysilicon portions 131 and is formed in the intermediate area of the one of the island-shaped polysilicon portions 131. The photoresist portions 14 have a width falling within the range of ⅓-½ of width of the island-shaped polysilicon portions 131.

By using the photoresist portions 14 as a mask, light ion doping is performed over two sides of each of the island-shaped polysilicon portions 131 to form two doped regions 1311 at two sides of each of the island-shaped polysilicon portions 131 and to form one channel region (i.e., non-doped region) 1312 between the two doped regions 1311. P ions are used in performing the light ion doping over the two sides of each of the island-shaped polysilicon portions 131 by using the photoresist portions 14 as the mask.

Further, either photoresist stripping process or photoresist ashing process is used to remove the photoresist portions 14. A gate insulating layer 15 is deposited on the substrate 100 by CVD, and then a first metal layer 16 is formed on the gate insulating layer 15 by using PVD. Preferably, the gate insulating layer 15 is made of silicon nitride or silicon oxide, and the first metal layer is made of molybdenum.

Then, a photoresist material is coated uniformly on the first metal layer 16. By patterning the first metal layer 16, a plurality of gate electrodes 161 that are separate from one another are correspondingly formed on the island-shaped polysilicon portions 131. The gate electrodes 161 have a width smaller than width of the island-shaped polysilicon portions 131. Each of the gate electrodes 161 covers each of the channel regions 1312 of the island-shaped polysilicon portions in a way that two ends of each of the gate electrodes 161 exceed two ends of each of the channel regions 1312 by a distance and the gate electrodes 161 covers a portion of the doped regions 1311. The distance by which two ends of each of the gate electrodes 161 exceed two ends of each of the channel regions 1312 ranges from 1 μm to 2 μm.

Figure 2B:
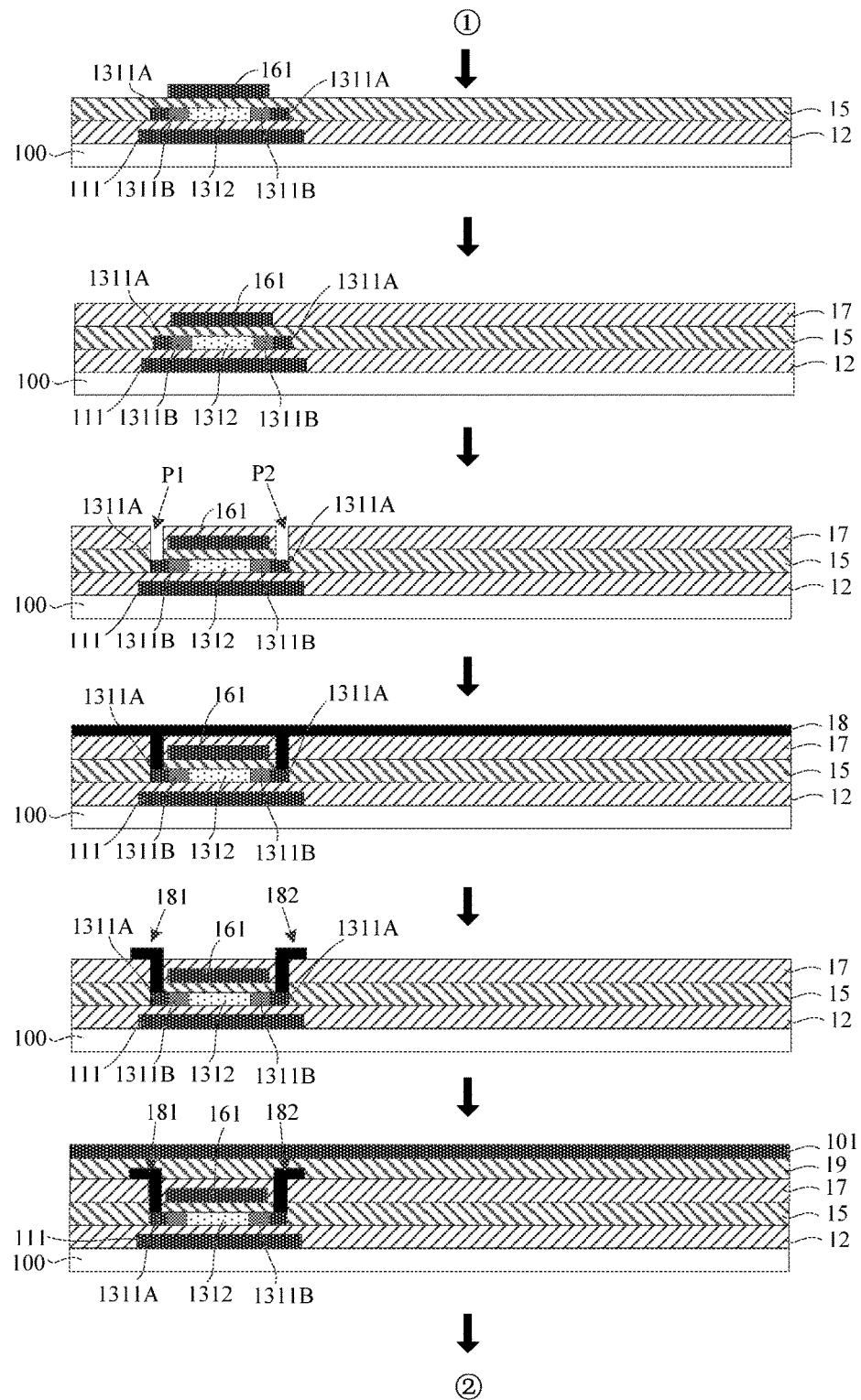

In step S105 (as shown in FIGS. 2A and 2B), by using the gate electrodes 161 as a mask, heavy ion doping is performed over each of the doped region 1311 that are not covered by the gate electrodes to form two N-type heavily doped regions 1311A at two sides of each of the island-shaped polysilicon portions 131, and to serve the doped regions 1311 disposed between each of the N-type heavily doped regions 1311A and the channel region 1312 as N-type lightly doped regions 1311B having a width of about 1.5 μm. P ions are used in performing the heavy ion doping over the doped regions 1311 that are not covered by the gate electrodes 161 by using the gate electrodes 161 as the mask.

In step S106, blanket deposition of an insulating material is performed by CVD to form an interlayer insulating layer 17 on the gate insulating layer 15 and the gate electrodes 161. Preferably, the interlayer insulating layer 17 is made of silicon nitride, silicon oxide, or a combination thereof.

Next, two first through-holes are formed on the interlayer insulating layer 17 and the gate insulating layer 15 above each of the two N-type heavily doped regions 1311A by photolithography to expose the two N-type heavily doped regions 1311A. The two first through-holes include the first through-hole P1 formed at one side of each of the gate electrodes 161 and the first through-hole P2 formed at the one side of each of the gate electrodes 161. The N-type heavily doped regions 1311A can be exposed completely or partially.

After that, blanket deposition of a third metal layer 18 is performed. With patterning of the third metal layer 18 by using photolithography and etching, a plurality of source electrodes 181 and a plurality of drain electrodes 182 are formed on the interlayer insulating layer 17. Each of the source electrodes 181 is electrically connected to one of the N-type heavily doped regions 1311A disposed at one side of one of the island-shaped polysilicon portions 131 via one of the through-holes P1, and each of the drain electrodes 182 is electrically connected to one of the N-type heavily doped regions 1311A disposed at the other side of one of the island-shaped polysilicon portions 131 via the through-hole P2. Preferably, the source electrode 181 and the drain electrode 182 are a molybdenum/aluminum/molybdenum composite layer.

Figure 2C:
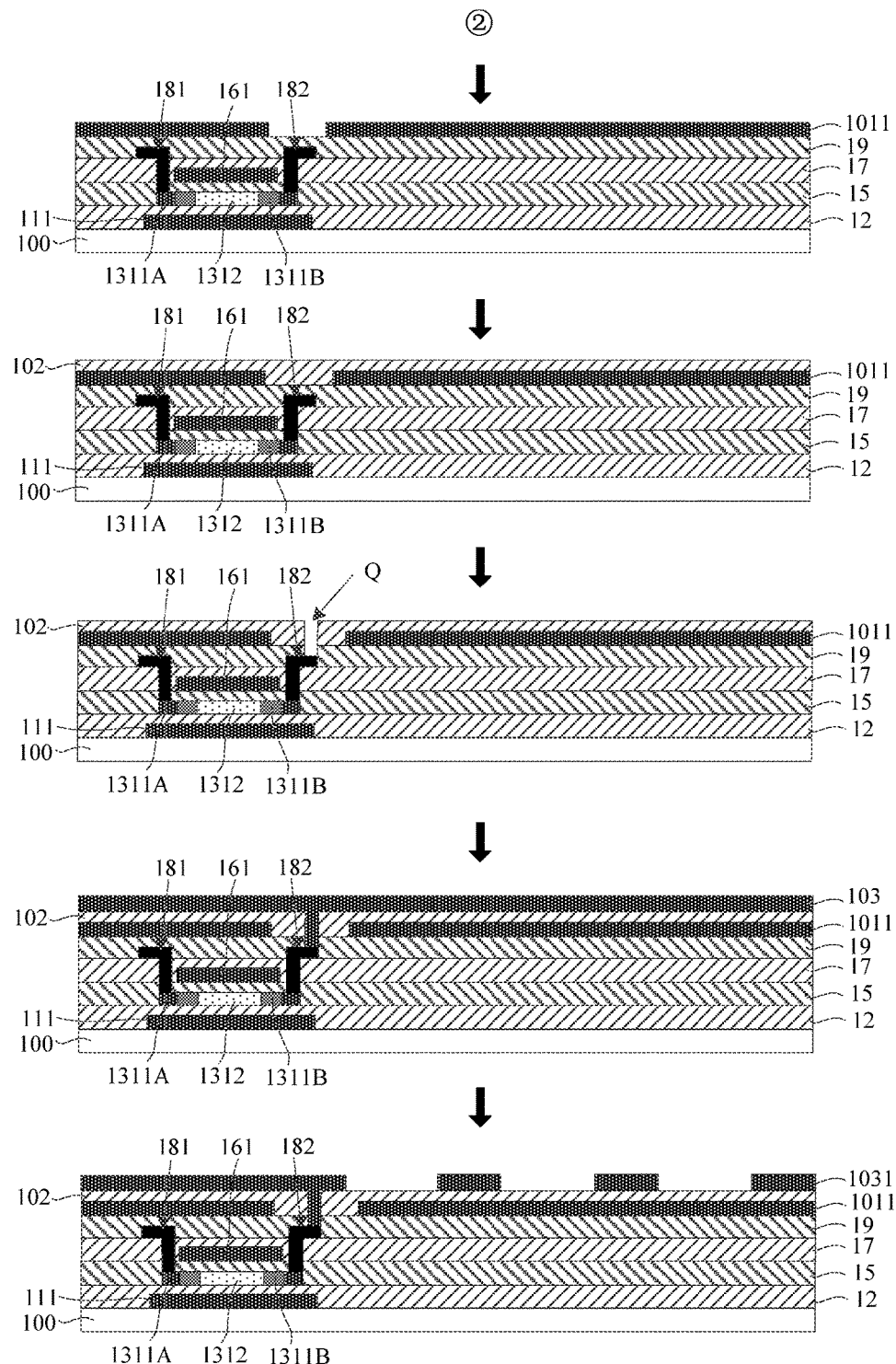

Please refer to FIGS. 2B and 2C. In some embodiments, after step S106, a planarization layer 19, a common electrode 101, and a passivation layer 102 can be further sequentially formed on the TFT substrate. A plurality of pixel electrodes 1031 are formed on the pixel electrodes 102.

Specifically, blanket deposition of the planarization layer 19 can be firstly performed by using CVD on the interlayer insulating layer 17, the source electrodes 181, and the drain electrodes 182. Then, a common electrode material layer 101 is deposited on the planarization layer 19. Thereafter, a photoresist material is coated on the common electrode material layer 101, and a portion of the common electrode material layer 101 above each of the drain electrodes 182 is removed by photolithography and etching to form the common electrode 1011 on the planarization layer 19. Preferably, the planarization layer 19 is an insulating material layer, and the common electrode 1011 is a transparent conductive metal oxide film or a transparent conductive metal film.

Then, the passivation layer 102 is formed on the planarization layer 19 and the common electrode 1011 by CVD. The passivation layer 102 can be made of silicon nitride, silicon oxide, etc. A second through-hole Q is formed on the planarization layer 19 and the passivation layer 102 above each of the drain electrodes 182 by photolithography to expose the drain electrodes 182. Preferably, the drain electrodes 182 are exposed partially.

In some embodiments, PVD is used to perform blanket deposition of a pixel electrode material layer 103. By using photolithography and etching, the pixel electrode material layer 103 is patterned to form a plurality of pixel electrodes 1031 on the passivation layer 102. Each of the pixel electrodes 1031 is electrically connected to one of the drain electrodes 182 via the second through-hole Q. In this way, the LTPS TFT substrate is manufactured.

According to one application, the pixel electrodes 1031 can be made of indium tin oxide (ITO) for increasing conductivity of the pixel electrodes.

From the above description, it is learned that the present disclosure provides a method for manufacturing an LTPS TFT substrate. According to the present disclosure, the N-type TFT structure in the LTPS TFT substrate is replaced with an N-type TFT structure where the gate electrodes overlap the lightly doped regions. It is by voltage of the gate electrode that resistance variation of the lightly doped region can be controlled. Therefore, kink effect occurring in N-type TFT can be suppressed, thus improving operating performance of devices.

The present disclosure further provides an LTPS substrate. The LTPS substrate includes a plurality of TFTs with each thereof corresponding to a light-shielding portion, a plurality of LTPS portions, a plurality of gate electrodes, a plurality of source electrodes, and a plurality of drain electrodes.

Figure 3:
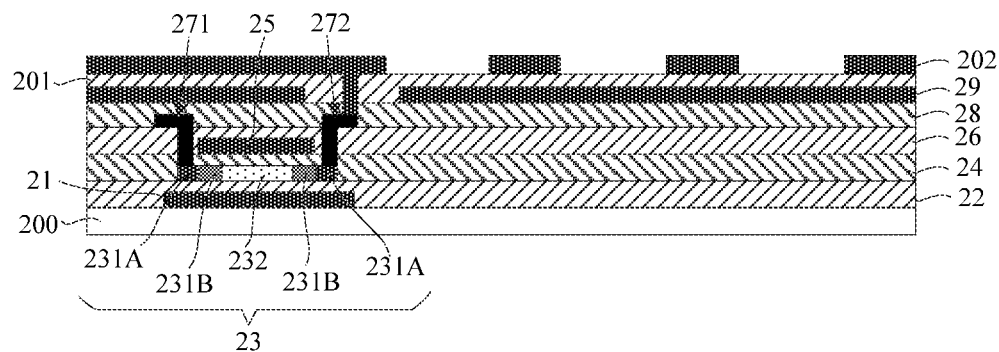
FIG. 3 is a schematic diagram showing a structure of an LTPS TFT substrate according to a preferred embodiment of the present disclosure.

Referring to FIG. 3, the LTPS TFT substrate includes:

a substrate 200;

a plurality of light-shielding portions 21 disposed on the substrate 200;

a buffer layer 22 disposed on the substrate 200 and the light-shielding portions 21;

a plurality of polysilicon portions 23 disposed on the buffer layer 22, wherein each of the polysilicon portions 22 includes: a channel region 232 disposed in an intermediate area of each of the polysilicon portions 23, two N-type heavily doped regions 231A disposed at two sides of each of the polysilicon portions 23, and an N-type lightly doped region 231B disposed between the channel region 232 and each of the adjacent N-type heavily doped regions 231A;

a gate insulating layer 24 disposed on the polysilicon portions 23 and the buffer layer 22;

a plurality of gate electrodes 25 disposed on the gate insulating layer 24, wherein the gate electrodes 25 have a width smaller than width of the polysilicon portions 23, and each of the gate electrodes 25 covers one of the channel regions 232 and the N-type lightly doped regions 231B of the polysilicon portions 23;

an interlayer insulating layer 26 disposed above the gate electrodes 25 and the gate insulating layer 24;

a plurality of source electrodes 271 disposed on the interlayer insulating layer 26, wherein each of the source electrodes 271 is electrically connected to one of the N-type heavily doped regions 231A disposed at one end of one of the polysilicon portions 23;

a plurality of drain electrodes 272 disposed on the interlayer insulating layer 26, wherein each of the drain electrodes 272 is electrically connected to the other end of the N-type heavily doped regions 231A disposed at the other end of one of the polysilicon portions 23.

Please still refer to FIG. 3. In some embodiments, the LTPS TFT substrate further includes:

a planarization layer 28 disposed on the source electrodes 271, the drain electrodes 272, and the interlayer insulating layers 26;

a common electrode 29 disposed on the planarization layer 28;

a passivation layer 201 disposed on the common electrode 29 and the planarization 28;

a plurality of pixel electrodes 202 disposed on the passivation layer 201.

Figure 4:
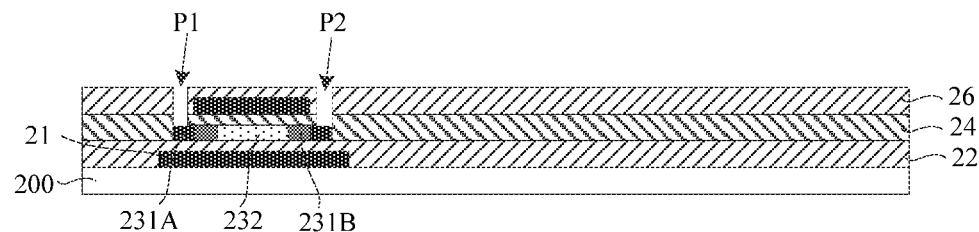
FIG. 4 is a schematic diagram showing a structure of an LTPS TFT substrate according to a preferred embodiment of the present disclosure.

Please refer to FIG. 4. There are two first through-holes (P1 and P2) disposed on the gate insulating layer 24 and the interlayer insulating layer 26 above the two N-type heavily doped regions 231A, and each of the source electrodes 271 and each of the drain electrodes 272 are electrically connected to one of the N-type heavily doped regions 231A via one of the first through-holes (P1 and P2), respectively.

Figure 5:
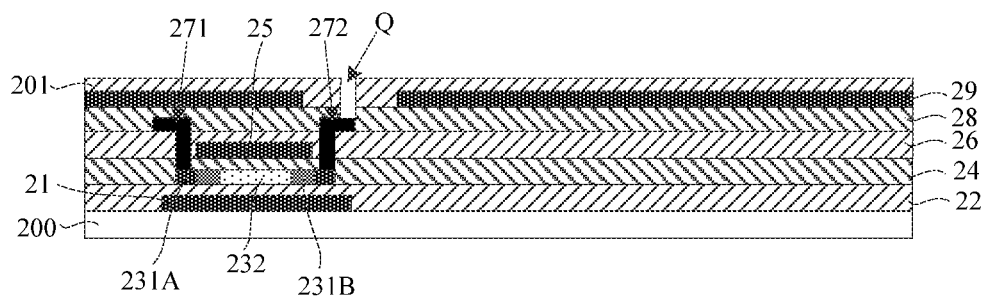
FIG. 5 is a schematic diagram showing another structure of an LTPS TFT substrate according to a preferred embodiment of the present disclosure.

In some embodiments (as shown in FIG. 5), there is a second through-hole Q disposed on the planarization layer 28 and the passivation layer 201 above each of the drain electrodes 272, and each of the pixel electrodes 202 is electrically connected to one of the drain electrodes 272 via the second through-hole Q.

In some embodiments, the substrate 200 is a glass substrate. The light-shielding portions 21 are made of an opaque metal material (such as Al, Ag, Cu, Mo, Au, etc.) or any combinations thereof, or alloy of any metals for preventing light emitted from backlight source from directly illuminating TFTs which may have adverse influence on logic circuits of substrate.

In some embodiments, the buffer layer 22 can be a composite layer consisted of a silicon nitride layer and a silicon oxide layer. In some embodiments, the silicon nitride layer has a thickness ranging from 40 nm to 100 nm, and the silicon oxide layer has a thickness ranging from 100 nm to 200 nm.

According to the embodiment of the present disclosure, the polysilicon portions 23 are entirely doped with B ions in order to adjust the threshold voltage (Vth) of N-type TFT. The N-type lightly doped regions 231B are doped with a few P ions. The N-type heavily doped regions 231A are doped with more P ions. In some embodiments, the N-type lightly doped regions have a width of about 1.5 μm.

In some embodiments, the gate insulating layer 24 can be made of silicon nitride or silicon oxide, and the gate electrodes can be made of molybdenum.

In some embodiments, the interlayer insulating layer 26 can be made of silicon nitride, silicon oxide, or a combination thereof.

In some embodiments, the gate electrodes 271 and the drain electrodes 272 can be a molybdenum/aluminum/molybdenum composite layer.

According to the embodiment of the present disclosure, the planarization layer 28 is an insulating material layer, such as a silicon nitride layer, a silicon oxide layer, etc. The common electrode 29 can be a transparent conductive metal oxide film or a transparent conductive metal film.

In some embodiments, the passivation layer 201 can be made of silicon nitride, silicon oxide layer, etc. The pixel electrodes 202 can be made of indium tin oxide (ITO) for increasing conductivity of the pixel electrodes.

From the above, it is learned that the present disclosure provides an LTPS TFT substrate. According to the present disclosure, the N-type TFT structure in the LTPS TFT substrate is replaced with an N-type TFT structure where the gate electrodes overlap the lightly doped regions. Since voltage of gate electrode will induce charges in the N-type lightly doped region, resistance of the N-type lightly doped region changes with voltage of gate electrode changed. Therefore, kink effect occurring in drain electrode output of N-type TFT can be suppressed, thus improving operation performance of devices.

In summary, while the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a low temperature polysilicon (LTPS) thin film transistor (TFT) substrate, comprising steps of:
   providing a substrate;
   forming a plurality of light-shielding portions on the substrate, and forming a buffer layer on the light-shielding portions and the substrate;
   depositing an LTPS layer on the buffer layer, patterning the LTPS layer to correspondingly form a plurality of island-shaped polysilicon portions over each of the light-shielding portions, and performing blanket ion doping over each of the island-shaped polysilicon portions;
   coating a photoresist material on each of the island-shaped polysilicon portions, patterning the photoresist material to form a plurality of photoresist portions, and performing light ion doping over two sides of each of the island-shaped polysilicon portions by using the photoresist portions as a mask to form two doped regions at two sides of each of the island-shaped polysilicon portions and to form one channel region between the two doped regions;
   removing the photoresist portions, sequentially forming a gate insulating layer and a first metal layer on the island-shaped polysilicon portions, and patterning the first metal layer to correspondingly form a gate electrode on each of the island-shaped polysilicon portions; wherein the gate electrodes have a width smaller than width of the island-shaped polysilicon portions, each of the gate electrodes covers each of the channel regions in a way that two ends of each of the gate electrodes exceed two ends of each of the channel regions by a distance and each of the gate electrodes covers a portion of the doped regions;
   performing heavy ion doping over each of the doped region that are not covered by the gate electrodes by using the gate electrodes as a mask to form two N-type heavily doped regions at two sides of each of the island-shaped polysilicon portions, and to serve the doped regions disposed between each of the N-type heavily doped regions and the channel region as N-type lightly doped regions; and
   forming an interlayer insulating layer as well as a plurality of source electrodes and a plurality of drain electrodes which are electrically connected to each of the N-type heavily doped regions on the gate electrodes.

2. The method for manufacturing the LTPS TFT substrate according to claim 1, wherein ions used in performing the light ion doping over the two sides of each of the island-shaped polysilicon portions by using the photoresist portions as the mask are P ions.

3. The method for manufacturing the LTPS TFT substrate according to claim 2, wherein ions used in performing the heavy ion doping over each of the doped region that are not covered by the gate electrodes by using the gate electrodes as the mask are P ions.

4. The method for manufacturing the LTPS TFT substrate according to claim 1, wherein ions used in performing the blanket ion doping over each of the island-shaped polysilicon portions are B ions.

5. The method for manufacturing the LTPS TFT substrate according to claim 1, wherein the step of forming the light-shielding portions on the substrate comprises steps of:
   depositing a second metal layer on the substrate by physical vapor deposition, and coating a photoresist material thereon; and
   patterning the second metal layer by photolithography and etching to form the light-shielding portions that are separate from one another.

6. The method for manufacturing the LTPS TFT substrate according to claim 1, wherein the step of forming the interlayer insulating layer as well as the source electrodes and the drain electrodes which are electrically connected to each of the N-type heavily doped regions on the gate electrodes comprises steps of:

performing blanket deposition of the interlayer insulating layer by chemical vapor deposition;

forming two first through-holes on the interlayer insulating layer and the gate insulating layer above each of the two N-type heavily doped regions by photolithography to expose the N-type heavily doped regions; and performing blanket deposition of a third metal layer, and patterning the third metal layer to form the source electrodes and the drain electrodes; wherein each of the source electrodes and each of the drain electrodes are electrically connected to one of the N-type heavily doped regions via one of the first through-holes, respectively.

7. The method for manufacturing the LTPS TFT substrate according to claim 1, wherein the step of sequentially forming the gate insulating layer and the first metal layer on the island-shaped polysilicon portions, and the step of patterning the first metal layer to correspondingly form the gate electrode on each of the island-shaped polysilicon portions comprise steps of:

depositing an insulating layer on the substrate by chemical vapor deposition;

depositing the first metal layer on the substrate by physical vapor deposition, and coating a photoresist material; and patterning the first metal layer by photolithography and etching to form the gate electrodes that are separate from one another.

8. The method for manufacturing the LTPS TFT substrate according to claim 1, wherein after forming the interlayer insulating layer as well as the source electrodes and the drain electrodes which are electrically connected to each of the N-type heavily doped regions on the gate electrodes, the method further comprises steps of:

sequentially depositing a planarization layer and a common electrode material layer on the interlayer insulating layer, the source electrodes, and the drain electrodes;

removing a portion of the common electrode material layer above each of the drain electrodes by photolithography and etching to form a common electrode on the planarization layer;

forming a passivation layer on the planarization layer and the common electrode;

forming a plurality of second through-holes on the planarization layer and the passivation layer above each of the drain electrodes by photolithography to expose the drain electrodes; and performing blanket deposition of a pixel electrode material layer, patterning the pixel electrode material layer to form a plurality of pixel electrodes on the passivation layer; wherein each of the pixel electrodes is electrically connected to one of the drain electrodes via one of the second through-holes.

9. The method for manufacturing the LTPS TFT substrate according to claim 1, wherein the pixel electrodes are made of indium tin oxide (ITO).

10. A method for manufacturing a low temperature polysilicon (LTPS) thin film transistor (TFT) substrate, comprising steps of:

providing a substrate;

forming a plurality of light-shielding portions on the substrate, and forming a buffer layer on the light-shielding portions and the substrate;

depositing an LTPS layer on the buffer layer, patterning the LTPS layer to correspondingly form a plurality of island-shaped polysilicon portions over each of the light-shielding portions, and performing blanket ion doping over each of the island-shaped polysilicon portions;

coating a photoresist material on each of the island-shaped polysilicon portions, patterning the photoresist material to form a plurality of photoresist portions, and performing light ion doping over two sides of each of the island-shaped polysilicon portions by using the photoresist portions as a mask to form two doped regions at two sides of each of the island-shaped polysilicon portions and to form one channel region between the two doped regions;

removing the photoresist portions, sequentially forming a gate insulating layer and a first metal layer on the island-shaped polysilicon portions, and patterning the first metal layer to correspondingly form a gate electrode on each of the island-shaped polysilicon portions;

wherein the gate electrodes have a width smaller than width of the island-shaped polysilicon portions, each of the gate electrodes covers each of the channel regions in a way that two ends of each of the gate electrodes exceed two ends of each of the channel regions by a distance and each of the gate electrodes covers a portion of the doped regions;

performing heavy ion doping over each of the doped region that are not covered by the gate electrodes by using the gate electrodes as a mask to form two N-type heavily doped regions at two sides of each of the island-shaped polysilicon portions, and to serve the doped regions disposed between each of the N-type heavily doped regions and the channel region as N-type lightly doped regions;

performing blanket deposition of an interlayer insulating layer;

forming two first through-holes on the interlayer insulating layer and the gate insulating layer above each of the two N-type heavily doped regions to expose the N-type heavily doped regions;

performing blanket deposition of a third metal layer, and patterning the third metal layer to form a plurality of source electrodes and a plurality of drain electrodes; wherein each of the source electrodes and each of the drain electrodes are electrically connected to one of the N-type heavily doped regions via one of the first through-holes, respectively; and sequentially forming a planarization layer, a common electrode, a passivation layer, and a plurality of pixel electrodes with each electrically connected to one of the drain electrodes on the interlayer insulating layer, the source electrodes, and the drain electrodes.

11. The method for manufacturing the LTPS TFT substrate according to claim 10, wherein ions used in performing the light ion doping over the two sides of each of the island-shaped polysilicon portions by using the photoresist portions as the mask are P ions, and ions used in performing the heavy ion doping over each of the doped region that are not covered by the gate electrodes by using the gate electrodes as the mask are P ions.

12. The method for manufacturing the LTPS TFT substrate according to claim 11, wherein ions used in performing the blanket ion doping over each of the island-shaped polysilicon portions are B ions.

13. The method for manufacturing the LTPS TFT substrate according to claim 10, wherein the step of forming the light-shielding portions on the substrate comprises steps of:

depositing a second metal layer on the substrate by physical vapor deposition, and coating a photoresist material thereon; and patterning the second metal layer by photolithography and etching to form the light-shielding portions that are separate from one another.

14. The method for manufacturing the LTPS TFT substrate according to claim 10, wherein the step of sequentially forming the gate insulating layer and the first metal layer on the island-shaped polysilicon portions, and the step of patterning the first metal layer to correspondingly form the gate electrode on each of the island-shaped polysilicon portions comprise:

depositing an insulating layer on the substrate by chemical vapor deposition;

depositing the first metal layer on the substrate by physical vapor deposition, and coating a photoresist material; and patterning the first metal layer by photolithography and etching to form the gate electrodes that are separate from one another.

15. The method for manufacturing the LTPS TFT substrate according to claim 10, wherein the steps of sequentially forming the planarization layer, the common electrode, the passivation layer, and the pixel electrodes with each electrically connected to one of the drain electrodes on the interlayer insulating layer, the source electrodes, and the drain electrodes comprises steps of:

sequentially depositing the planarization layer and a common electrode material layer on the interlayer insulating layer, the source electrodes, and the drain electrodes;

removing a portion of the common electrode material layer above each of the drain electrodes by photolithography and etching to form the common electrode on the planarization layer;

forming the passivation layer on the planarization layer and the common electrode;

forming a plurality of second through-holes on the planarization layer and the passivation layer above each of the drain electrodes by photolithography to expose the drain electrodes;

performing blanket deposition of a pixel electrode material layer, patterning the pixel electrode material layer to form the pixel electrodes on the passivation layer; wherein each of the pixel electrodes is electrically connected to one of the drain electrodes via one of the second through-holes.

16. The method for manufacturing the LTPS TFT substrate according to claim 10, wherein chemical vapor deposition is used in performing blanket deposition of the interlayer insulating layer.

17. The method for manufacturing the LTPS TFT substrate according to claim 10, wherein the pixel electrodes are made of indium tin oxide (ITO).

18. A low temperature polysilicon (LTPS) thin film transistor (TFT) substrate, comprising:

a substrate;

a plurality of light-shielding portions disposed on the substrate;

a buffer layer disposed on the substrate and the light-shielding portions;

a plurality of polysilicon portions disposed on the buffer layer, wherein each of the polysilicon portions comprises: a channel region disposed in an intermediate area of each of the polysilicon portions, two N-type heavily doped regions disposed at two sides of each of the polysilicon portions, and N-type lightly doped regions disposed between the channel region and the adjacent N-type heavily doped regions;

a gate insulating layer disposed on the polysilicon portions and the buffer layer;

a plurality of gate electrodes disposed on the gate insulating layer, wherein the gate electrodes have a width smaller than width of the polysilicon portions, and each of the gate electrodes covers each of the channel regions and the N-type lightly doped regions;

an interlayer insulating layer disposed above the gate electrodes and the gate insulating layer;

a plurality of source electrodes disposed on the interlayer insulating layer, wherein each of the source electrodes is electrically connected to one of the N-type heavily doped regions disposed at one end of one of the polysilicon portions; and a plurality of drain electrodes disposed on the interlayer insulating layer, wherein each of the drain electrodes is electrically connected to the other of the N-type heavily doped regions disposed at the other end of one of the polysilicon portions.

19. The LTPS TFT substrate according to claim 18, wherein there are two first through-holes disposed on the gate insulating layer and the interlayer insulating layer above the N-type heavily doped regions, and each of the source electrodes and each of the drain electrodes are electrically connected to one of the N-type heavily doped regions via one of the first through-holes, respectively.

20. The LTPS TFT substrate according to claim 18, wherein the LTPS TFT substrate further comprises:

a planarization layer disposed on the source electrodes, the drain electrodes, and the interlayer insulating layers;

a common electrode disposed on the planarization layer;

a passivation layer disposed on the common electrode and the planarization; and a plurality of pixel electrodes disposed on the passivation layer, wherein there are a plurality of second through-holes disposed on the planarization layer and the passivation layer above each of the drain electrodes, and each of the pixel electrodes is electrically connected to one of the drain electrodes via one of the second through-holes.

* * * * *